United States Patent [19]
Odani et al.

[11] Patent Number: 5,436,071
[45] Date of Patent: Jul. 25, 1995

[54] CERMET CUTTING TOOL AND PROCESS FOR PRODUCING THE SAME

[75] Inventors: Niro Odani; Hironori Yoshimura; Akira Osada; Tetsuya Tanaka; Seiichirou Nakamura, all of Ibaraki, Japan

[73] Assignee: Mitsubishi Materials Corporation, Japan

[21] Appl. No.: 73,328

[22] Filed: Jun. 8, 1993

Related U.S. Application Data

[63] Continuation-in-part of Ser. No. 644,446, Jan. 23, 1991, abandoned.

Foreign Application Priority Data

| Jan. 31, 1990 | [JP] | Japan | 2-21048 |
| Aug. 4, 1992 | [JP] | Japan | 4-227874 |
| Aug. 11, 1992 | [JP] | Japan | 4-235265 |
| Aug. 11, 1992 | [JP] | Japan | 4-235266 |
| Aug. 11, 1992 | [JP] | Japan | 4-235267 |

[51] Int. Cl.$^6$ ............... B23P 15/28; C23C 16/30
[52] U.S. Cl. ........................ 428/336; 51/307; 51/309; 428/216; 428/698; 428/701; 428/702; 428/472; 428/469
[58] Field of Search ............ 428/698, 216, 336, 701, 428/702; 51/307, 309

[56] References Cited

U.S. PATENT DOCUMENTS

| 3,807,008 | 4/1974 | Reedy, Jr. | 29/195 |
| 3,971,656 | 7/1976 | Rudy | 75/203 |
| 4,196,233 | 4/1980 | Bitzer et al. | 427/249 |
| 4,463,033 | 7/1984 | Kikuchi | 427/255.3 |
| 4,693,944 | 9/1987 | Sugisawa et al. | 428/698 |
| 4,902,395 | 2/1990 | Yoshimura | 204/192.3 |
| 5,059,491 | 10/1991 | Odani et al. | 428/614 |

FOREIGN PATENT DOCUMENTS

| 54-117510 | 9/1979 | Japan |
| 57-79169 | 5/1982 | Japan |
| 59-52704 | 12/1984 | Japan |
| 60-33353 | 2/1985 | Japan |

Primary Examiner—Archene Turner
Attorney, Agent, or Firm—Scully, Scott, Murphy & Presser

[57] ABSTRACT

The present invention discloses a cermet cutting tool, and process for producing the same, comprising a substrate formed from titanium carbo-nitride based cermet, and a hard coating layer of average thickness 0.5~20 μm, formed onto the surface of the cermet substrate comprising a lower layer formed from at least one layer of a compound selected from the group consisting of titanium carbide (TiC), titanium nitride (TIN), titanium carbo-nitride (TiCN), titanium carbo-oxide (TiCO) and titanium carbo-oxi-nitride (TiCNO), and aluminum oxide ($Al_2O_3$). Additionally, at least one of the layers comprising the hard coating layer is a titanium carbo-nitride layer, and at least one layer of this titanium carbo-nitride layer comprises a longitudinal growth crystal structure. The process for producing a cermet cutting tool according to the present invention comprises a step for preparing a substrate from titanium carbo-nitride based cermet, and a step for forming a hard coating layer onto the surface of said substrate using a chemical vapor deposition method wherein in at least one part of this step, chemical vapor deposition is performed using a reaction gas composed of 1~5% of $TiCl_4$, 0.1~1% of $CH_3CN$, 0~25% of $N_2$ with the remaining portion being composed of $H_2$, under a reaction temperature of 800°~900° C. and a reaction pressure of 30~200 Torr.

12 Claims, 8 Drawing Sheets (CERMET CUTTING TOOL 13 OF THE PRESENT INVENTION)

(CERMET CUTTING TOOL 2 OF THE PRESENT INVENTION)

(PRIOR ART CUTTING TOOL 2)

(CERMET CUTTING TOOL 13 OF THE PRESENT INVENTION)

TiCN (P) 4 MICRON

CERMET SUBSTRATE (PRIOR ART CUTTING TOOL 15)

(CERMET CUTTING TOOL 31 OF THE PRESENT INVENTION)

(PRIOR ART CUTTING TOOL 26)

(CERMET CUTTING TOOL 38 OF THE PRESENT INVENTION)

TiN  1 MICRON
Al2O3  2 MICRON
TiCN  4 MICRON
TiN  1 MICRON (PRIOR ART CUTTING TOOL 27)

CERMET CUTTING TOOL AND PROCESS FOR PRODUCING THE SAME

BACKGROUND OF THE INVENTION

1. Field of the Invention

The present invention is a continuation-in-part application of U.S. Patent Application Ser. No. 644,446, filed Jan. 23, 1991, now abandoned, and relates to a cermet cutting tool, and process for producing the same, in which a hard coating layer is formed onto the surface of a titanium carbo-nitride based cermet substrate. In particular, the present invention pertains to improvements for enhancing the chipping resistance and wear resistance of the blade member.

2. Background Art

Conventionally, cermets, containing at least one metal of carbide, nitride and carbo-nitride of titanium (Ti), zirconium (Zr), hafnium (Hf), tantalum (Ta), niobium (Nb), tungsten (W), molybdenum (Mo) and chromium (Cr) as a hard phase-constituting component and iron family metals such as cobalt (Co), nickel (Ni) and the like as binder metals, have been widely used to form blade members or inserts for use in finish cutting of steel.

In recent years, the aforementioned cermets possessing surface coatings composed of TiC, TiCN and the like, which further improve wear resistance, are being produced.

For example, Japanese Patent Application First Publication No. Sho 54-117510 discloses a cermet cutting tool which is formed by applying to a titanium carbo-nitride based cermet substrate using a chemical vapor deposition process, a hard coating layer of thickness 0.5~20 μm which is formed from at least one layer of a compound selected from the group consisting of titanium carbide (TIC), titanium nitride (TIN), titanium carbo-nitride (TiCN), titanium carbo-oxide (TiCO), titanium carbo-oxi-nitride (TiCNO) and aluminum oxide ($Al_2O_3$). In addition, as the substrate, use of a TiCN based cermet in which the incorporated amount of binding phase-constituting component, Co or Ni, is comparatively higher in the surface layer portion when compared to the substrate interior, is known.

In this case, as the chemical vapor deposition process, a conventional process is employed in which a TiCN coating layer is formed onto the cermet surface using a mixed gas composed of 4% of $TiCl_4$, 3% of $CH_4$, 4% of $N_2$, and 89% of $H_2$ (% by volume) at a temperature of 1000° C. and a pressure of 100 Torr inside the chemical vapor deposition apparatus. The reaction in this case is represented by the following formula:

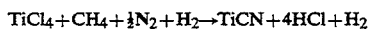

$TiCl_4 + CH_4 + \frac{1}{2}N_2 + H_2 \rightarrow TiCN + 4HCl + H_2$

However, when the aforementioned prior art cermet cutting tools are used in steel and cast-iron high-speed cutting inserts, chipping of the cutting insert occurs easily due to the lack of toughness of the hard coating layer, and considerable wear occurs due to this chipping, thereby exhausting the tool life in a comparatively short time.

One source generating the aforementioned problems lies in the fact that the binding phase-constituting component (Ni or Co) diffuses into the TiCN layer during chemical vapor deposition, creating a materially inferior TiCN layer. In other words, the iron family metals such as Co and Ni which comprise the binding phase-constituting components, due to the high coating temperature (1000° C.) of prior art chemical vapor deposition processes, diffuse into the TiCN layer and cause loss of the original wear resistance, resulting in formation of a coating layer possessing a low wear resistance. However, if chemical vapor deposition is attempted at a temperature of 900° C. or less where it is difficult for the binding phase-constituting component to diffuse into the TiCN layer, the activity of reaction gases such as methane, nitrogen and the like is reduced, and the reaction does not occur, which results in the TiCN coating layer being unobtainable. Consequently, under the aforementioned temperature conditions of the prior art, a coating layer cannot be formed.

The inventors of the present invention have conducted various research in order to obtain a TiCN coating layer with superior wear resistance by efficient chemical vapor deposition of a TiCN layer at a temperature of 900° C. or less, where it is difficult for the aforementioned binding phase-constituting component to diffuse into the TiCN layer. As a result, when adding acetonitrile ($CH_3CN$) to the mixed gas used in the chemical vapor deposition, highly efficient formation of a TiCN coating layer is possible even when chemical vapor deposition is performed at a temperature of 900° C. or less: the TiCN coating layer formed in this manner, due to non-diffusion of the aforementioned binding phase-constituting component, was confirmed by observation to possess a superior wear resistance.

Furthermore, the inventors of the present invention, in order to further improve the wear resistance of the TiCN layer, have continued their research. As a result, they have discovered a novel development in that when chemical vapor deposition is performed using a reaction gas composed of 1~5% of $TiCl_4$, 0.1~1% of $CH_3CN$, 0~25% of $N_2$ with the remaining portion being composed of $H_2$, under a reaction temperature of 800°~900° C. and a reaction pressure of 30~200 Torr, at least one portion of the TiCN layer comprises a longitudinal growth crystal structure, which is a change from the normal granular crystal structure, resulting in further improvement of both the chipping resistance and the wear resistance.

SUMMARY OF THE INVENTION

The present invention is based on this aforementioned discovery, and it is therefore an object of the present invention to provide, by means of improving the toughness of the hard coating layer, a cermet cutting tool, and process for producing the same, with improved chipping resistance and wear resistance of the cutting insert.

In order to achieve this objective, a first aspect of the present invention is directed to providing a cermet cutting tool comprising the following:

a. a substrate formed from titanium carbo-nitride based cermet; and b. a hard coating layer of average thickness 0.5~20 μm, formed onto the surface of the aforementioned substrate; this layer being formed from at least one layer of a compound selected from the group consisting of titanium carbide (TIC), titanium nitride (TIN), titanium carbo-nitride (TiCN), titanium carbo-oxide (TiCO), titanium carbo-oxi-nitride (TiCNO) and aluminum oxide ($Al_2O_3$); wherein at least one of the layers comprising the aforementioned hard coating layer is a titanium carbo-nitride layer, and at least one layer of this titanium carbo-nitride layer comprises a longitudinal growth crystal structure.

In addition, a second aspect of the present invention is directed to providing a cermet cutting tool comprising the following:
a. a substrate formed from titanium carbo-nitride based cermet; and
b. a hard coating layer of average thickness 0.5~20 μm, formed onto the surface of the aforementioned substrate comprising at least one layer of the compound titanium carbo-nitride; the aforementioned at least one layer of the compound titanium carbo-nitride comprising the above-mentioned hard coating layer comprises at least one of the following crystal structures:
  (1) a crystal structure which changes from a granular crystal structure to a longitudinal growth crystal structure as it progresses away from the aforementioned substrate;
  (2) a crystal structure which changes from a granular crystal structure to a longitudinal growth crystal structure and back to a granular crystal structure as it progresses away from the aforementioned substrate; and
  (3) a crystal structure which changes from a longitudinal growth crystal structure to a granular crystal structure as it progresses away from the aforementioned substrate.

Furthermore, a third aspect of the present invention is directed to providing a cermet cutting tool comprising the following:
a. a substrate formed from titanium carbo-nitride based cermet; and
b. a hard coating layer of average thickness 0.5~20 μm, formed onto the surface of the aforementioned substrate comprising a lower layer composed of at least one layer of the compound titanium carbo-nitride, and an upper layer formed from at least one layer of a compound selected from the group consisting of titanium carbide (TIC), titanium nitride (TIN), titanium carbo-nitride (TiCN), titanium carbo-oxide (TiCO), titanium carbo-oxi-nitride (TiCNO) and aluminum oxide ($Al_2O_3$); the entire aforementioned lower layer comprises at least one of the following crystal structures:
  (1) a crystal structure which changes from a granular crystal structure to a longitudinal growth crystal structure as it progresses away from the aforementioned substrate;
  (2) a crystal structure which changes from a granular crystal structure to a longitudinal growth crystal structure and back to a granular crystal structure as it progresses away from the aforementioned substrate; and
  (3) a crystal structure which changes from a longitudinal growth crystal structure to a granular crystal structure as it progresses away from the aforementioned substrate.

A fourth aspect of the present invention is directed to providing a cermet cutting tool comprising the following:
a. a substrate formed from titanium carbo-nitride based cermet; and
b. a hard coating layer of average thickness 0.5~20 μm, formed onto the surface of the aforementioned substrate comprising a lower layer formed from at least one layer of a compound selected from the group consisting of titanium carbide (TIC), titanium nitride (TIN), titanium carbo-nitride (TiCN), titanium carbo-oxide (TiCO) and titanium carbo-oxi-nitride (TiCNO), and an upper layer formed from at least one layer of a compound selected from the group consisting of titanium carbide (TIC), titanium nitride (TIN), titanium carbo-nitride (TiCN), titanium carbo-oxide (TiCO), titanium carbo-oxi-nitride (TiCNO) and aluminum oxide ($Al_2O_3$); wherein at least one of the layers comprising the aforementioned upper layer is a titanium carbo-nitride layer, and at least one layer of this titanium carbo-nitride layer comprises at least one of the following crystal structures:
  (1) a crystal structure which changes from a granular crystal structure to a longitudinal growth crystal structure as it progresses away from the aforementioned substrate;
  (2) a crystal structure which changes from a granular crystal structure to a longitudinal growth crystal structure and back to a granular crystal structure as it progresses away from the aforementioned substrate; and
  (3) a crystal structure which changes from a longitudinal growth crystal structure to a granular crystal structure as it progresses away from the aforementioned substrate.

In all of the cermet cutting tools provided in aforementioned first through fourth aspects of the present invention, if the average thickness of the hard coating layer is less than 0.5 μm, sufficient wear resistance is unobtainable due to this hard coating layer. On the other hand, if the average thickness of the hard coating layer exceeds 20 μm, chipping of the cutting insert occurs easily and a superior wear resistance becomes impossible to obtain.

The cermet comprising the aforementioned substrate contains 70~95% by weight of a solid solution of carbo-nitride represented by the formula $(Ti_xM_y)(C_uN_v)$, (wherein M is at least one metal selected from the group consisting of transition metals in groups $IV_A$, $V_A$ and $VI_A$ of the Periodic TABLE with the exception of titanium, and x, y, u and v are molar ratios which satisfy the relations of $x+y=1$, $u+v=1$, $0.5 \leq x \leq 0.95$, $0.05 \leq y \leq 0.5$, $0.2 \leq u \leq 0.8$ and $0.2 \leq v \leq 0.8$) as the hard-dispersed phase-constituting component, with the remainder comprising one or two metals selected from the group consisting of cobalt and nickel as a binder phase-constituting component.

If the content of the aforementioned hard-dispersed phase-constituting component is less than 70% by weight and the content of the binder phase-constituting component exceeds 30% by weight, the wear resistance of the cermet substrate is lowered. On the ocher hand, if the content of hard-dispersed phase-constituting component exceeds 95% by weight and the content of the binder phase-constituting component is less than 5% by weight, the cermet substrate becomes susceptible to chipping, in other words, the chipping resistance is poor, both of which are undesirable results.

It is possible for the incorporated amount of the aforementioned binder phase-constituting component to be relatively greater in the surface portion of the aforementioned cermet when compared with that of the substrate interior. In the case when the incorporated amount of the binder phase-constituting component is greater at the substrate surface, the chipping resistance of the cermet cutting tool is further improved.

Each of the cermet cutting tools of the present invention having the aforementioned respective structures, as a result of possessing a hard coating layer with a high toughness at least one portion of which comprises a TiCN layer with a longitudinal growth crystal structure, displayed a superior wear resistance when used in steel and cast-iron high-speed cutting inserts which, in particular, demand a high resistance to chipping. Consequently, superior cutting properties can be maintained over a long period of time.

In addition, the process for producing the cermet cutting tool of the present invention comprises the following steps:

a. a step for preparing a substrate from a titanium carbo-nitride based cermet;
b. a step for forming a hard coating layer onto the surface of the aforementioned substrate using a chemical vapor deposition method wherein in at least one part of this step, chemical vapor deposition is performed using a reaction gas composed of $1 \sim 5\%$ of $TiCl_4$, $0.1 \sim 1\%$ of $CH_3CN$, $0 \sim 25\%$ of $N_2$ with the remaining portion being composed of $H_2$, under a reaction temperature of $800° \sim 900°$ C. and a reaction pressure of $30 \sim 200$ Torr.

In this process, the reaction in which TiCN is formed is represented by the following formula:

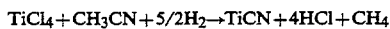

$$TiCl_4 + CH_3CN + 5/2H_2 \rightarrow TiCN + 4HCl + CH_4$$

By means of the aforementioned process, a hard coating layer incorporating a TiCN layer with at least one portion containing longitudinal growth crystal structure can be formed, and the chipping and wear resistances of this hard coating layer can be improved. In addition, in accordance with this process, diffusion of the binding phase-constituting component of the titanium carbo-nitride based cermet into the TiCN layer is extremely low, thus reduction of the material quality of the TiCN layer stemming from diffusion of the binding phase-constituting component can be prevented, resulting in the enhancement of both chipping and wear resistances.

However, if the aforementioned reaction temperature is less than 800° C., it becomes impossible to form a TiCN layer with longitudinal growth crystal structure. However, if this reaction temperature exceeds 900° C., the binding phase-constituting component diffuses into the TiCN coating layer resulting in formation of a coating layer with low wear resistance, both of which are undesirable. In addition, if the reaction pressure is less than 30 Torr, the reaction time is too long, which is an industrially undesirable result. On the other hand, if the reaction pressure exceeds 200 Torr, the reaction speed is too fast resulting in a non-uniform membrane thickness. In addition, if any of the concentrations of the $TiCl_4$, $CH_3CN$, and $N_2$ components of the aforementioned reaction gas fall outside the above prescribed ranges, formation of a TiCN layer with longitudinal growth crystal structure becomes difficult.

It is also possible to form a TiN layer above and/or below the TiCN layer. As the method for forming this TiN layer, conventional methods known in the prior art in which chemical vapor deposition is performed using nitrogen gas or ammonium gas may be employed. In forming the TiN layer, a reaction temperature of 900° C. or greater is required. In addition, the wettability of the TiN layer with the binding phase-constituting component of the cermet substrate (ie. Co or Ni) is low, which results in greater prevention of diffusion of the binding phase-constituting component into the TiCN layer. In this case, the membrane thickness of the TiN layer is preferably less than 4 µm.

EXAMPLES

Figure 1:
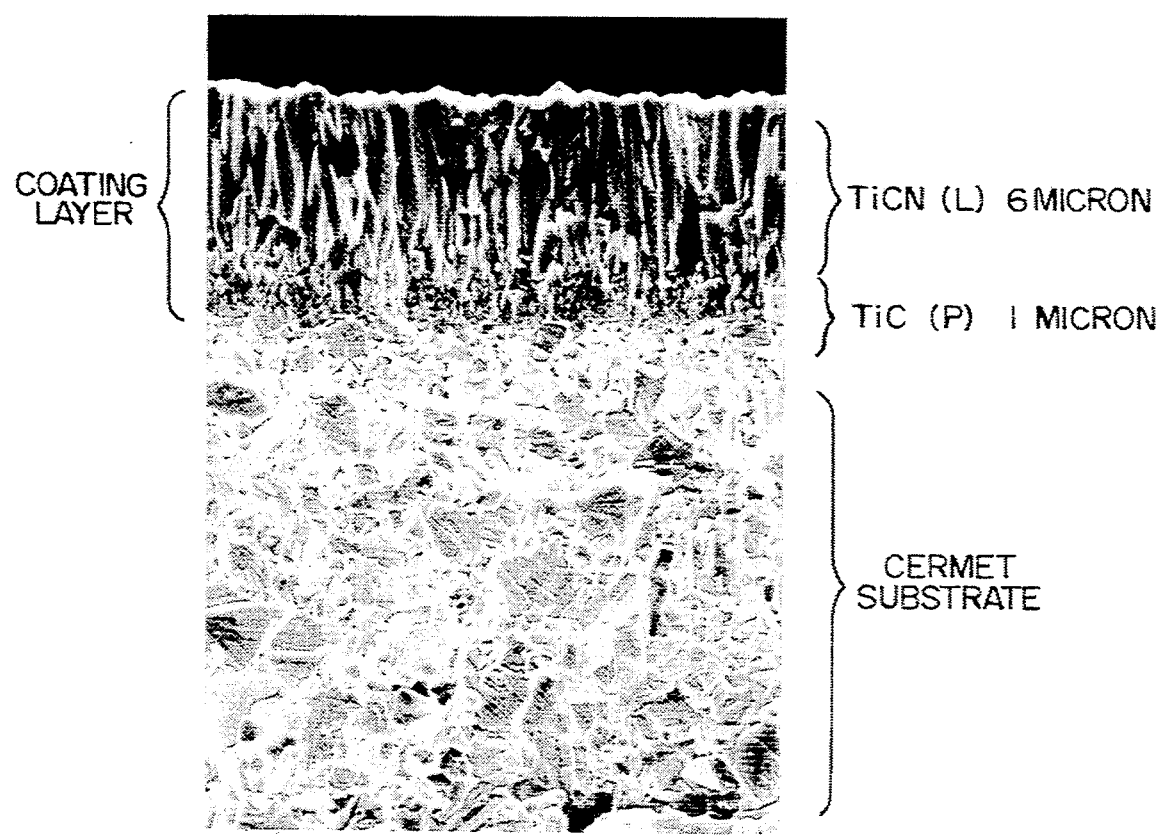
FIG. 1 is an enlarged photograph displaying a cross-sectional view of the surface portion of a cermet cutting tool (cutting tool 2 of the present invention) according to the present invention taken by scanning electron microscope.

The present invention will now be explained with reference to the Examples.

Example 1

Powders of TiCN, TiC, TiN, TaC, NbC, WC, $Mo_2C$, ZrC, Co and Ni each having a predetermined average particle size within the range of $1 \sim 3$ µm, were prepared as starting materials. These starting materials were combined so as to produce the composition shown in TABLE 1, and were mixed together for 72 hours using a ball mill under wet conditions. After drying, the resultant mixed powder was pressed and a large number of green compact bodies were formed.

A portion of these compacted bodies were then sintered at a fixed temperature from $1450° \sim 1500°$ C. for one hour under $10^{-2}$ Torr in a vacuum to produce TiCN based cermet substrates $A \sim D$ in which the binding phase-constituting component was not contained in a relatively larger amount at the surface layer portion.

The remainder of the aforementioned compacted bodies were first heated under rising temperature and brought to sintering temperature under $10^{-2}$ Torr in a vacuum; after reaching a predetermined temperature within the range of $1450° \sim 1550°$ C., the sintering conditions were changed to 10 Torr in $N_2$ environment and maintained for one hour; and cooling from sintering temperature was performed in a vacuum under 0.1 Torr to produce TiCN based cermet substrates E and F in which the binding phase-constituting component was contained in a relatively larger amount at the surface layer portion. The respective thicknesses of the surface layer portions of these substrates E and F, and the maximum amount of binding phase-constituting component incorporated into these surface layer portions are shown in TABLE 1.

Furthermore, all of the aforementioned TiCN based cermet substrates A~F were shaped to conform to cutting chip standards of ISO-CNMG120408.

Each respective type of coating layer comprising granular crystal structures, and TiCN layers comprising longitudinal growth crystal structures were formed onto the surfaces of the aforementioned TiCN based cermet substrates A~F using a conventional chemical vapor deposition apparatus, according to the layer constructions shown in TABLES 3 and 4, to produce cutting tools 1~12 of the present invention. The coating layers comprising granular crystal structures were formed under the conditions shown in TABLE 2, while the TiCN layers comprising longitudinal growth crystal structures were formed under the following conditions.
(Conditions for forming longitudinal growth crystal structure)
  Reaction gas composition:
  $TiCl_4$—1.5% by volume
  $CH_3CN$—0.5% by volume
  $N_2$—25% by volume
  $H_2$—73% by volume
  Reaction temperature:
  860° C.
  Pressure:
  50 Torr On the other hand, under the conditions shown in TABLE 2, the hard coating layers, comprising granular crystal structures and having the respective average thicknesses and compositions shown in TABLES 4 and 5, were formed onto the surfaces of the aforementioned TiCN based cermet substrates A~F to produce prior art TiCN based cermet cutting tools 1~12.

Subsequently, all of the cermet cutting tools were subjected to both a steel wet-type continuous high-speed cutting test and a steel dry-type intermittent high-speed cutting test. The continuous cutting test measured the amount of flank wear of the cutting edge, while the intermittent cutting test measured the amount of time necessary to reach the limits of tool life with chipping as the source. The results of these tests are shown in TABLE 6, with the cutting test conditions as follows:
(Continuous cutting test conditions)
  Workpiece: Round bar (JIS. SCM440)
  Cutting speed: 250 m/min.
  Feed rate: 0.2 mm/rev.
  Depth of cut: 1 m
  Cutting time: 30 min.
(Intermittent cutting test conditions)
  workpiece: Round bar with 4 longitudinal grooves (JIS. SNCM439)
  Cutting speed: 200 m/min.
  Feed rate: 0.2 m/rev.
  Depth of cut: 1 mm In addition, photographs enlarged 5000 times displaying the longitudinal cross-sectional structures of the surface portions of cutting tool 2 of the present invention and cutting tool 2 of the prior art, as taken by scanning electron microscope, are shown in FIGS. 1 and 2.

Figure 2:
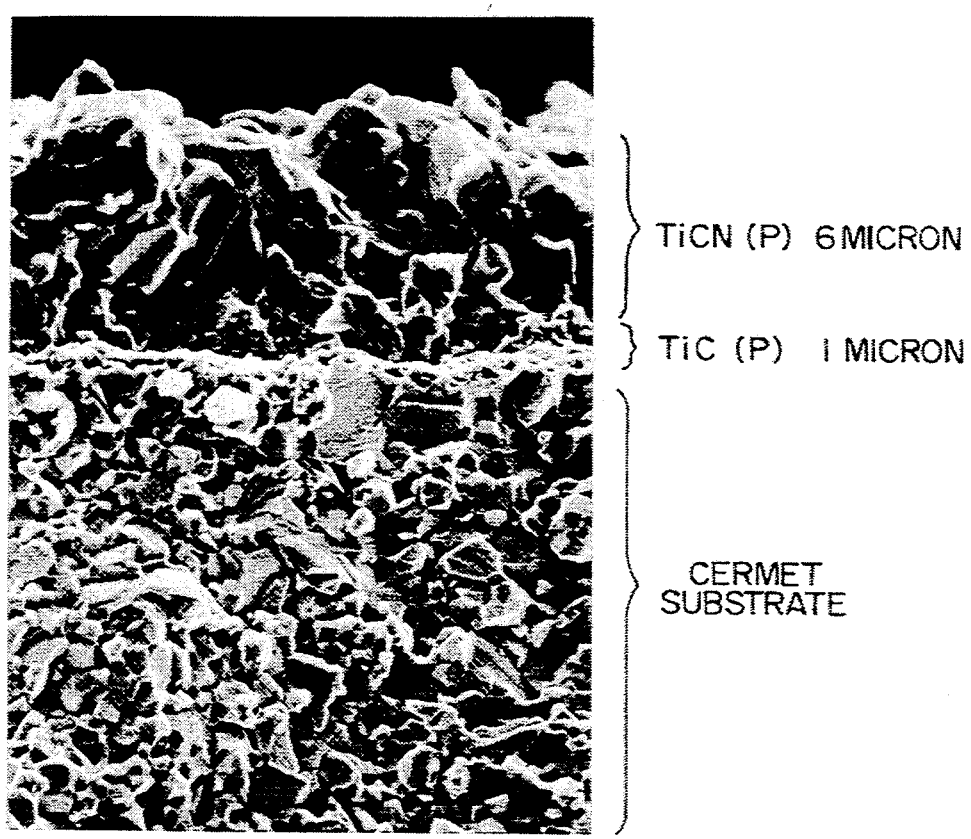
FIG. 2 is an enlarged photograph displaying a cross-sectional view of the surface portion of a prior art cermet cutting tool (prior art cutting tool 2) taken by scanning electron microscope.

As seen from the results of TABLES 1~6 and FIGS. 1~2, cermet cutting tools 1~12 of the present invention possessing at least one TiCN layer in their hard coating layer, and at least one layer within this TiCN layer comprising a longitudinal growth crystal structure, display superior wear resistance in steel high-speed continuous cutting and superior chipping resistance in high-speed intermittent cutting, and consequently display superior cutting properties over a long period of time when compared with prior art cutting tools 1~12, all of which are formed with a hard coating layer consisting of granular crystal structure.

Example 2

Powders of TiCN, TiC, TiN, TaC, NbC, WC, $Mo_2C$, ZrC, Co and Ni each having a predetermined average particle size within the range of 1~2 μm, were prepared as starting materials. These starting materials were combined so as to produce the compositions shown in TABLE 7, and processed under the same conditions as in Example 1 to produce TiCN based cermet substrates G~I, in which the binding phase-constituting component was not contained in a relatively larger amount at the surface layer portion, and TiCN based cermet substrates J~L, in which the binding phase-constituting component was contained in a relatively larger amount at the surface layer portion. The thicknesses of the surface layer portions of the substrates containing the binding phase-constituting component in a relatively larger amount, and the maximum amount of binding phase-constituting component incorporated into these surface layer portions are shown together in TABLE 7.

Subsequently, TiCN layers comprising granular crystal structures, and TiCN layers comprising longitudinal growth crystal structures were formed onto the surfaces of the aforementioned TiCN based cermet substrates G~L using a conventional chemical vapor deposition apparatus under the following conditions, according to the respective layer constructions and thicknesses shown in TABLES 8 and 9, to produce cutting tools 13~24 of the present invention.
(Conditions for forming TiCN granular crystal structure)
  Reaction gas composition:
  $TiCl_4$—3% by volume
  $CH_4$—5% by volume
  $N_2$—25% by volume
  $H_2$—67% by volume
  Reaction temperature: 1020° C.
  Pressure: 100 Torr
(Conditions for forming longitudinal growth crystal structure)
  Reaction gas composition:
  $TiCl_4$—1.5% by volume
  $CH_3CN$—0.5% by volume
  $N_2$—25% by volume
  $H_2$—73% by volume
  Reaction temperature: 860° C.
  Pressure: 50 Torr On the other hand, TiCN layers all comprising granular crystal structures were formed onto the surfaces of the aforementioned TiCN based cermet substrates G~L, as shown in TABLE 9, under exactly the same conditions as the aforementioned products of the present invention to produce prior art TiCN based cermet cutting tools 13~18.

Subsequently, all of the cermet cutting tools were subjected to both a steel dry-type continuous high-speed cutting test and a cast-iron wet-type high-speed cutting test under the conditions outlined below, and the amount of flank wear of the cutting edge was measured. The results of these tests are shown in TABLES 8 and 9.

(Steel dry-type high-speed cutting test conditions)
Workpiece: SCM440; Hardness: $H_B220$
Cutting speed: 250 m/min.
Feed rate: 0.2 mm/rev.
Depth of cut: 1 mm
Cutting time: 30 min.

(Cast-iron wet-type high-speed cutting test conditions)
Workpiece: FC30; Hardness: $H_B200$
Cutting speed: 300 m/min.
Feed rate: 0.2 mm/rev.
Depth of cut: 1 mm
Cutting time: 30 min.

Figure 3:
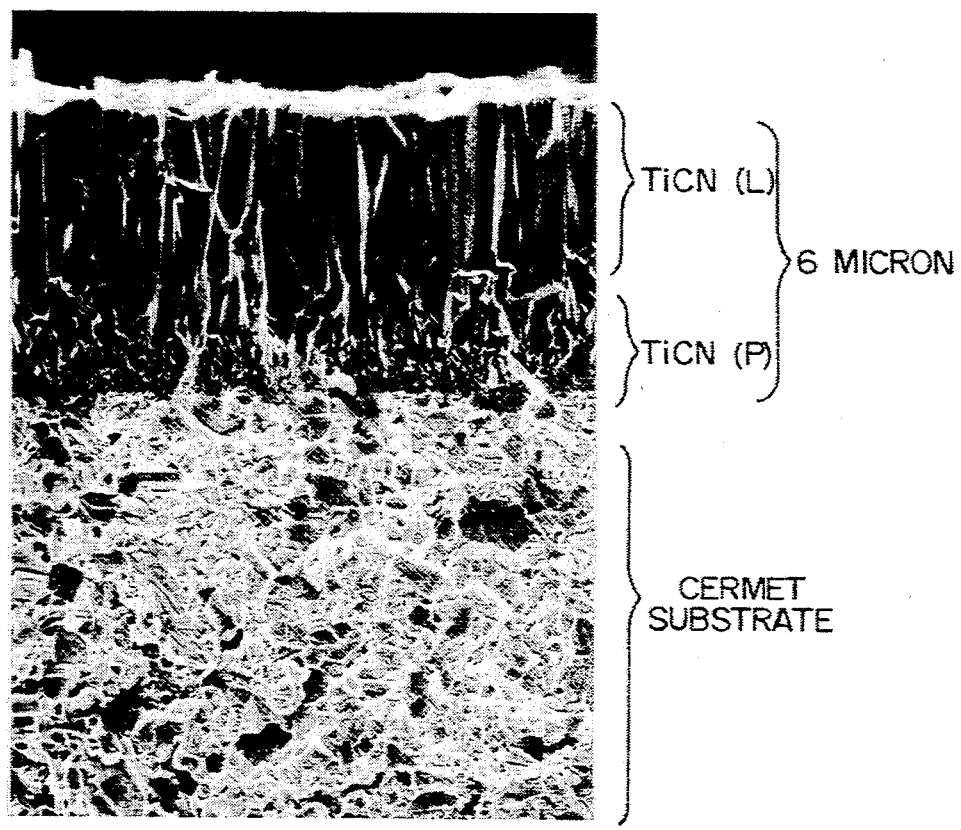
FIG. 3 is an enlarged photograph displaying a cross-sectional view of the surface portion of a cermet cutting tool (cutting tool 13 of the present invention) according to the present invention taken by scanning electron microscope.
Figure 4:
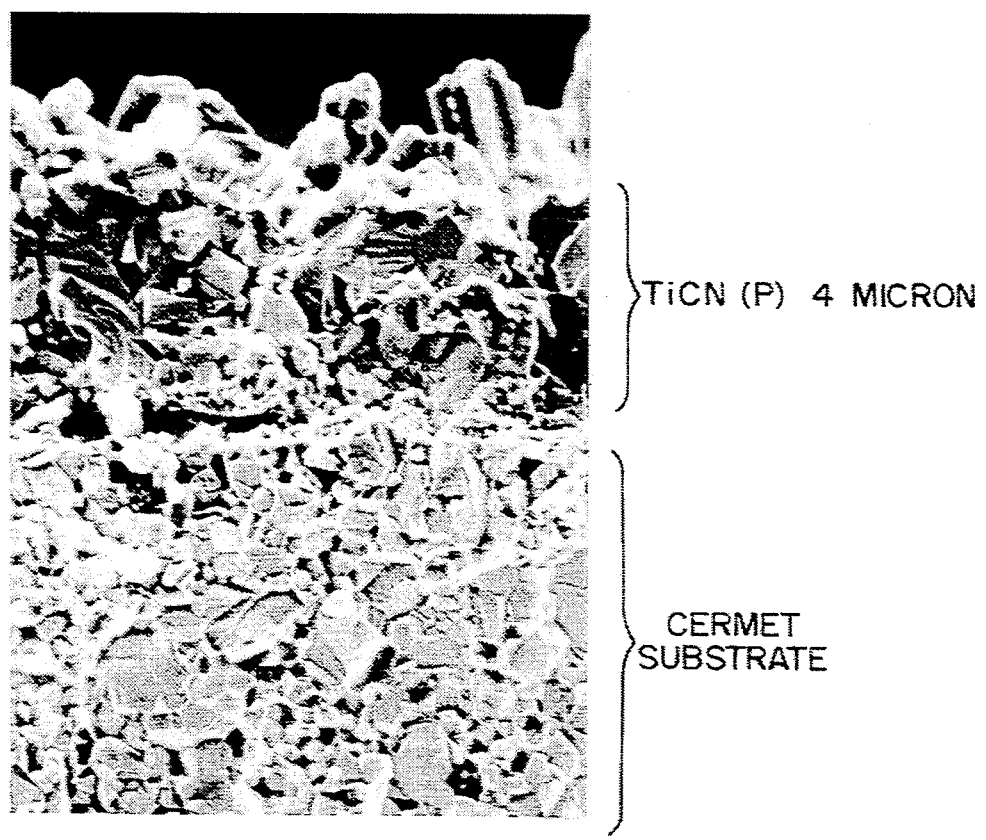
FIG. 4 is an enlarged photograph displaying a cross-sectional view of the surface portion of a prior art cermet cutting tool (prior art cutting tool 15) taken by scanning electron microscope.

In addition, photographs enlarged 5000 times displaying the longitudinal cross-sectional structures of the surface portions of cutting tool 13 of the present invention and cutting tool 15 of the prior art, as taken by scanning electron microscope, are shown in FIGS. 3 and 4. As shown in FIG. 3, cutting tool 13 of the present invention is formed with a crystal structure which changes from a granular crystal structure to a longitudinal growth crystal structure and then back to a granular crystal structure as it progresses away from the substrate. In contrast, prior art cutting tool 15, as shown in FIG. 4, comprises a TiCN layer comprising only a granular crystal structure.

As seen from the results of TABLES 8~9 and FIGS. 3~4, cermet cutting tools 13~24 of the present invention possessing within a TiCN layer comprising the hard coating layer, at least one layer consisting of a crystal structure which changes from a granular crystal structure to a longitudinal growth crystal structure, a crystal structure which changes from a granular crystal structure to a longitudinal growth crystal structure and then back to a granular crystal structure, or a crystal structure which changes from a longitudinal growth crystal structure to a granular crystal structure, as it progresses away from the substrate, display superior wear resistance and chipping resistance in steel and cast-iron high-speed cutting where chipping occurs easily, when compared with prior art cutting tools 13~18.

Example 3

TiCN based cermet substrates G~I, in which the binding phase-constituting component was not contained in a relatively larger amount at the surface layer portion, and TiCN based cermet substrates J~L, in which the binding phase-constituting component was contained in a relatively larger amount at the surface layer portion were produced using the same composition and process as with the cermet substrates of Example 2.

Subsequently, TiCN layers consisting of granular crystal structures, and TiCN layers consisting of longitudinal growth crystal structures were formed onto the surfaces of the aforementioned TiCN based cermet substrates G~L using a conventional chemical vapor deposition apparatus, under the same conditions as in Example 2, to produce a TiCN lower layer. Furthermore, on top of this lower layer an upper layer, comprising a granular crystal structure and possessing the compositions and thicknesses shown in TABLE 10, was formed using a conventional chemical vapor deposition apparatus under the general conditions shown in TABLE 11 to produce cermet cutting tools 25~32 of the present invention.

On the other hand, hard coating layers, comprising granular crystal structures and possessing the respective compositions and thicknesses shown in TABLE 12, were formed onto the surfaces of the aforementioned TiCN based cermet substrates G~L, under the general conditions shown in TABLE 11, to produce prior art TiCN based cermet cutting tools 19~26.

Subsequently, all of the cermet cutting tools were subjected to both a steel dry-type high-speed cutting test and an cast-iron wet-type high-speed cutting test as in Example 2, and the amount of flank wear of the cutting edge was measured. The results of these tests are shown in TABLE 13.

Figure 5:
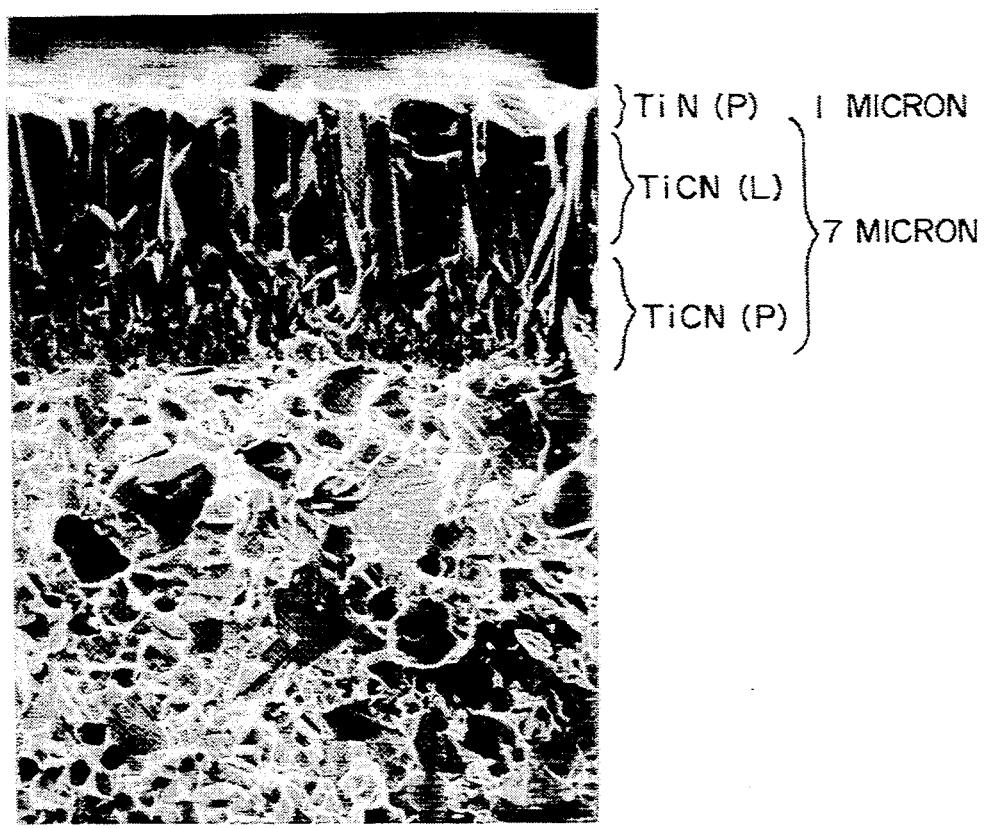
FIG. 5 is an enlarged photograph displaying a cross-sectional view of the surface portion of a cermet cutting tool (cutting tool 31 of the present invention) according to the present invention taken by scanning electron microscope.
Figure 6:
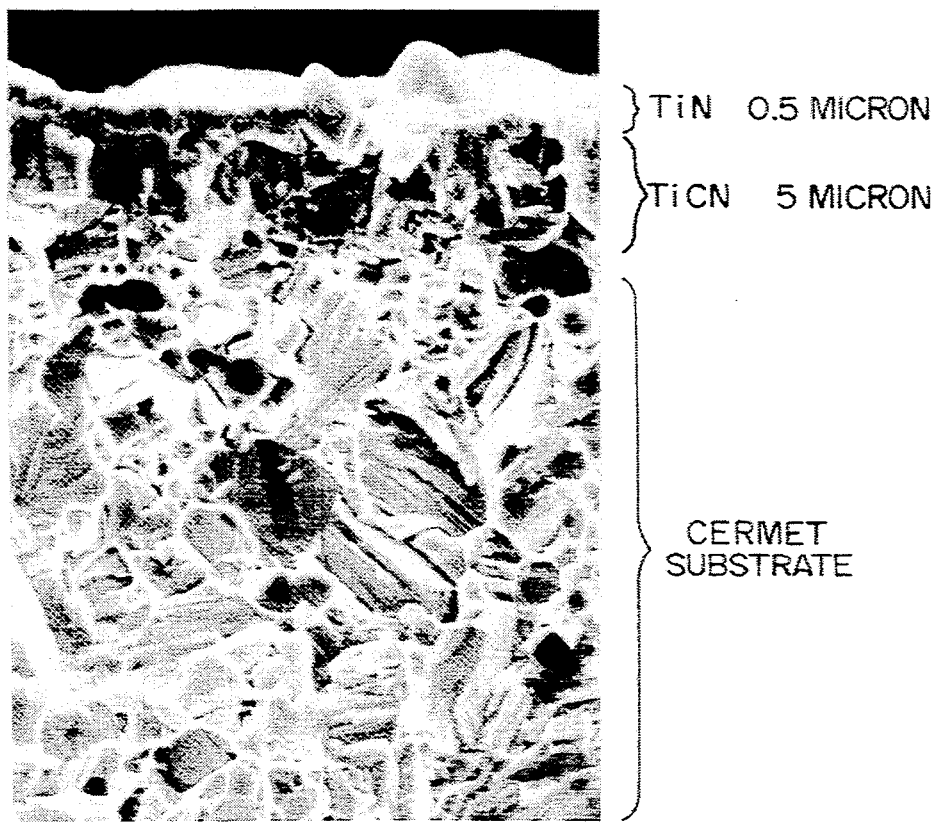
FIG. 6 is an enlarged photograph displaying a cross-sectional view of the surface portion of a prior art cermet cutting tool (prior art cutting tool 26) taken by scanning electron microscope.

In addition, photographs enlarged 5000 times displaying the longitudinal cross-sectional structures of the surface portions of cutting tool 31 of the present invention and cutting tool 25 of the prior art, as taken by scanning electron microscope, are shown in FIGS. 5 and 6. As shown in FIG. 5, cutting tool 31 of the present invention is formed with a hard coating layer comprising a lower TiCN layer which changes from a granular crystal structure to a longitudinal growth crystal structure as it progresses away from the substrate, and an upper TiCN layer comprising a granular crystal structure. In contrast, prior art cutting tool 25, as shown in FIG. 6, comprises TiCN and TiN layers formed with only a granular crystal structure.

As seen from the results of TABLES 10~13 and FIGS. 5~6, cermet cutting tools 25~32 of the present invention possessing a hard coating layer comprising a TiCN layer in which at least one layer comprises a crystal structure which changes from a granular crystal structure to a longitudinal growth crystal structure, a crystal structure which changes from a granular crystal structure to a longitudinal growth crystal structure and then back to a granular crystal structure, or a crystal structure which changes from a longitudinal growth crystal structure to a granular crystal structure, as it progresses away from the substrate, display superior wear resistance and chipping resistance in steel and cast-iron high-speed cutting where chipping occurs easily, when compared with prior art cutting tools 19~26.

Example 4

TiCN based cermet substrates G~I, in which the binding phase-constituting component was not contained in a relatively larger amount at the surface layer portion, and TiCN based cermet substrates J~L, in which the binding phase-constituting component was contained in a relatively larger amount at the surface layer portion, were produced using the same composition and process as with the cermet substrates of Example 2.

Subsequently, onto each surface of the aforementioned TiCN based cermet substrates G~L, a lower layer comprising at least one layer consisting of a granular crystal structure and possessing the respective compositions and thicknesses shown in TABLE 14, was formed using a conventional chemical vapor deposition apparatus under the conditions shown in TABLE 11.

Following this, under the same conditions as shown in TABLE 11, the upper layers, each comprising at least one layer and possessing the respective compositions and thicknesses shown in TABLE 14, were formed. These upper layers each comprise at least one TiCN layer, and at least one layer within each respective TiCN layer was combined under the granular crystal structure forming conditions or longitudinal growth crystal structure forming conditions described below, to produce cermet cutting tools 33~40 of the present invention possessing the crystal structures shown in TABLE 14.

(Conditions for forming TiCN granular crystal structure)
  Reaction gas composition:
   $TiCl_4$—3% by volume
   $CH_4$—5% by volume
   $N_2$—25% by volume
   $H_2$—67% by volume
  Reaction temperature: 950° C.
  Pressure: 100 Torr (Conditions for forming longitudinal growth crystal structure)
  Reaction gas composition:
   $TiCl_4$—1.5% by volume
   $CH_3CN$—0.5% by volume
   $N_2$—25% by volume
   $H_2$—73% by volume
  Reaction temperature: 860° C.
  Pressure: 50 Torr On the other hand, hard coating layers, comprising granular crystal structures and possessing the respective compositions and thicknesses shown in TABLE 15, were formed onto the surfaces of the aforementioned TiCN based cermet substrates G~L, under the general conditions shown in TABLE 11, to produce prior art TiCN based cermet cutting tools 27~34.

Subsequently, all of the cermet cutting tools were subjected to both a steel dry-type high-speed cutting test and an cast-iron wet-type high-speed cutting test as in Example 2, and the amount of flank wear of the cutting edge was measured. The results of these tests are shown in TABLE 16.

Figure 7:
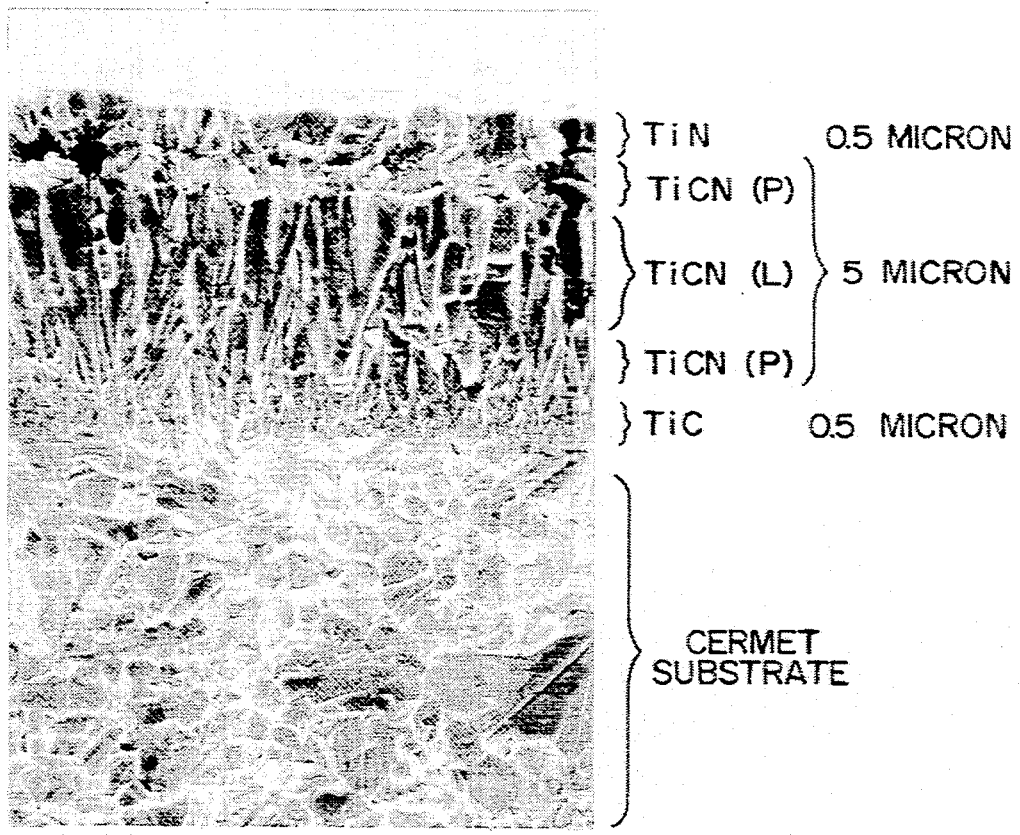
FIG. 7 is an enlarged photograph displaying a cross-sectional view of the surface portion of a cermet cutting tool (cutting tool 38 of the present invention) according to the present invention taken by scanning electron microscope.
Figure 8:
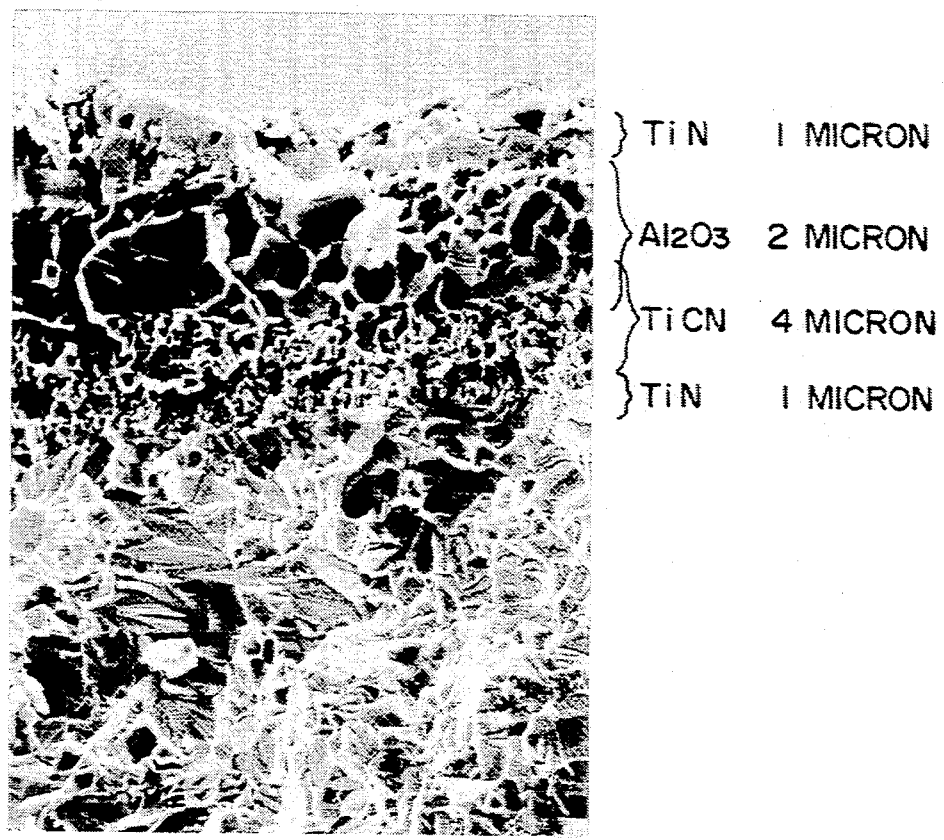
FIG. 8 is an enlarged photograph displaying a cross-sectional view of the surface portion of a prior art cermet cutting tool (prior art cutting tool 27) taken by scanning electron microscope.

In addition, photographs enlarged 5000 times displaying the longitudinal cross-sectional structures of the surface portions of cutting tool 38 of the present invention and cutting tool 32 of the prior art, as taken by scanning electron microscope, are shown in FIGS. 7 and 8.

As seen from the results of TABLES 14~16 and FIGS. 7~8, cermet cutting tools 33~40 of the present invention, comprising as the upper layer of the hard coating layer, at least one TiCN layer comprising a crystal structure which changes from a granular crystal structure to a longitudinal growth crystal structure, a crystal structure which changes from a granular crystal structure to a longitudinal growth crystal structure and then back to a granular crystal structure, or a crystal structure which changes from a longitudinal growth crystal structure to a granular crystal structure, as it progresses away from the substrate, display superior wear resistance and chipping resistance in steel and cast-iron high-speed cutting where chipping occurs easily, when compared with prior art cutting tools 27~34.

TABLE 1

| Cermet substrate classification | Distributional Composition (% by weight) | | | | | | | | | | Binding phase enhanced surface portion | |
|---|---|---|---|---|---|---|---|---|---|---|---|---|
| | | | | | | | | | | | Max incorporated amt. of binding phase (% by wt) | Thickness ($\mu$m) |
| | Co | Ni | TaC | NbC | WC | Mo2C | ZrC | TiC | TiN | TiCN | | |
| A | 8 | 4 | 9 | 1 | 15 | 8 | 0.5 | R | 20 | — | — | — |
| B | 8 | 6 | 10 | 1 | 10 | 8 | — | — | 5 | — | — | — |
| C | 12 | 6 | 9 | 1 | 15 | 9 | 0.5 | R | 20 | — | — | — |
| D | 14 | 4 | 15 | 2 | 16 | — | 0.3 | R | 20 | — | — | — |
| E | 12 | 4 | 10 | 1 | 15 | — | 0.5 | 18 | R | — | 26 | 20 |
| F | 7 | 7 | 12 | 1 | 16 | — | 0.2 | — | 5 | R | 21 | 30 |

R = Remaining portion

TABLE 2

| Hard covering layer composition | Conditions for forming the hard covering layer granular crystal structure | | |
|---|---|---|---|
| | | Reaction environment | |
| | Reaction gas composition (% by volume) | Pressure (Torr) | Temp (°C.) |
| TiC | $TiCl_4$: 4%, $CH_4$: 5%, $H_2$: 91% | 100 | 1030 |
| TiN | $TiCl_4$: 4%, $N_2$: 8%, $H_2$: 88% | 100 | 980 |
| TiCN | $TiCl_4$: 4%, $CH_4$: 3%, $N_2$: 4%, $H_2$: 89% | 100 | 1000 |
| TiCO | $TiCl_4$: 4%, CO: 6%, $H_2$: 90% | 100 | 1000 |
| TiCNO | $TiCl_4$: 4%, CO: 3%, $N_2$: 3%, $H_2$: 90% | 100 | 1000 |
| $Al_2O_3$ | $AlCl_3$: 3%, $CO_2$: 5%, $H_2$: 92% | 100 | 1000 |

TABLE 3

| Classification (Cutting tool of the | Hard covering layer | | |
|---|---|---|---|
| | First layer | Second layer | Third layer |
| | Average | Average | Average |

TABLE 3-continued

| present invention) | Substrate number | Composition (structure) | thickness (μm) | Composition (structure) | thickness (μm) | Composition (structure) | thickness (μm) |
|---|---|---|---|---|---|---|---|
| 1 | A | TiN (P) | 1 | TiCN (L) | 6 | TiN (P) | 0.5 |
| 2 |   | TiC (P) | 1 | TiCN (L) | 6 | — | — |
| 3 | B | TiN (P) | 1 | TiCN (L) | 6 | TiN (P) | 1 |
| 4 |   | TiC (P) | 1 | TiCN (P) | 1 | TiCN (L) | 5 |
| 5 | C | TiC (P) | 1 | TiCN (L) | 4 | TiN (P) | 0.5 |
| 6 |   | TiC (P) | 1 | TiCN (L) | 4 | TiCO (P) | 0.5 |
| 7 | D | TiN (P) | 0.5 | TiCN (L) | 3 | TiN (P) | 0.5 |
| 8 |   | TiCN (P) | 1 | TiCN (L) | 3 | TiCN (P) | 1 |

| Classification (Cutting tool of the present invention) | Substrate number | Hard covering layer | | | |
|---|---|---|---|---|---|
| | | Fourth layer | | Fifth layer | |
| | | Composition (structure) | Average thickness (μm) | Composition (structure) | Average thickness (μm) |
| 1 | A | — | — | — | — |
| 2 |   | — | — | — | — |
| 3 | B | — | — | — | — |
| 4 |   | TiCN (P) | 1 | TiN (P) | 1 |
| 5 | C | — | — | — | — |
| 6 |   | Al₂O₃ (P) | 1.5 | TiN (P) | 0.5 |
| 7 | D | — | — | — | — |
| 8 |   | TiCN (L) | 2 | TiN (P) | 0.5 |

P = Granular crystal structure; L = Longitudinal crystal structure

TABLE 4

| | | Hard covering layer | | | | | |
|---|---|---|---|---|---|---|---|
| | | First layer | | Second layer | | Third layer | |
| Classification | Substrate number | Composition (structure) | Average thickness (μm) | Composition (structure) | Average thickness (μm) | Composition (structure) | Average thickness (μm) |
| Cutting tool covering of the present invention | | | | | | | |
| 9 | E | TiN (P) | 1 | TiCN (L) | 6 | TiN (P) | 0.5 |
| 10 |   | TiC (P) | 1 | TiCN (L) | 2 | TiCN (P) | 1 |
| 11 | F | TiN (P) | 1 | TiCN (L) | 6 | TiCNO (P) | 0.5 |
| 12 |   | TiN (P) | 1 | TiCN (L) | 5 | — | — |
| 1 | A | TiN (P) | 1 | TiCN (P) | 6 | TiN (P) | 0.5 |
| 2 |   | TiC (P) | 1 | TiCN (P) | 6 | — | — |
| 3 | B | TiN (P) | 1 | TiCN (P) | 6 | TiN (P) | 1 |
| 4 |   | TiC (P) | 1 | TiCN (P) | 7 | TiN (P) | 1 |

| Classification | Substrate number | Hard covering layer | | | |
|---|---|---|---|---|---|
| | | Fourth layer | | Fifth layer | |
| | | Composition (structure) | Average thickness (μm) | Composition (structure) | Average thickness (μm) |
| Prior art cutting tool covering | | | | | |
| 9 | E | — | — | — | — |
| 10 |   | TiCN (L) | 2 | TiN (P) | 1 |
| 11 | F | Al₂O₃ (P) | 1 | TiN (P) | 0.5 |
| 12 |   | — | — | — | — |
| 1 | A | — | — | — | — |
| 2 |   | — | — | — | — |
| 3 | B | — | — | — | — |
| 4 |   | — | — | — | — |

P = Granular crystal structure; L = Longitudinal crystal structure

TABLE 5

| | | Hard covering layer | | | | | |
|---|---|---|---|---|---|---|---|
| | | First layer | | Second layer | | Third layer | |
| Classification | Substrate number | Composition (structure) | Average thickness (μm) | Composition (structure) | Average thickness (μm) | Composition (structure) | Average thickness (μm) |
| Prior art cutting tool coverings | | | | | | | |
| 5 | C | TiN (P) | 1 | TiCN (P) | 4 | TiN (P) | 0.5 |
| 6 |   | TiC (P) | 1 | TiCN (P) | 4 | TiCO (P) | 0.5 |
| 7 | D | TiN (P) | 0.5 | TiCN (P) | 3 | TiN (P) | 0.5 |
| 8 |   | TiCN (P) | 7 | TiN (P) | 0.5 | — | — |
| 9 | E | TiN (P) | 1 | TiCN (P) | 6 | TiN (P) | 0.5 |
| 10 |   | TiC (P) | 1 | TiCN (P) | 6 | TiN (P) | 1 |
| 11 | F | TiN (P) | 1 | TiCN (P) | 6 | TiCNO (P) | 0.5 |

TABLE 5-continued

| | | | | | |
|---|---|---|---|---|---|
| 12 | | TiN (P) | 1 | TiCN (P) | 5 | — | — |

| | | Hard covering layer | | | |
|---|---|---|---|---|---|
| | | Fourth layer | | Fifth layer | |
| Classification | Substrate number | Composition (structure) | Average thickness (μm) | Composition (structure) | Average thickness (μm) |
| Prior art cutting tool coverings | | | | | |
| 5 | C | — | — | — | — |
| 6 | | Al₂O₃ (P) | 1.5 | TiN (P) | 0.5 |
| 7 | D | — | — | — | — |
| 8 | | — | — | — | — |
| 9 | E | — | — | — | — |
| 10 | | — | — | — | — |
| 11 | F | Al₂O₃ (P) | 1 | TiN (P) | 0.5 |
| 12 | | — | — | — | — |

P = Granular crystal structure; L = Longitudinal crystal structure

TABLE 6

| Classification | Continuous cutting Amount of flak wear (mm) | Intermittent cutting Cutting time (min.) | Classification | Continuous cutting Amount of flak wear (mm) | Intermittent cutting Cutting time (min.) |
|---|---|---|---|---|---|
| Cutting tool covering of the present invention | | | Prior art cutting tool covering | | |
| 1 | 0.11 | 7.4 | 1 | 0.23 | 1.0 |
| 2 | 0.12 | 7.2 | 2 | 0.27 | 1.2 |
| 3 | 0.13 | 8.0 | 3 | 0.26 | 0.9 |
| 4 | 0.12 | 8.6 | 4 | 0.28 | 1.1 |
| 5 | 0.15 | 12.0 | 5 | 0.27 | 1.4 |
| 6 | 0.13 | 8.5 | 6 | 0.27 | 1.6 |
| 7 | 0.22 | 13.6 | 7 | 0.34 | 2.3 |
| 8 | 0.15 | 10.9 | 8 | 0.26 | 2.0 |
| 9 | 0.12 | 12.5 | 9 | 0.22 | 1.8 |
| 10 | 0.14 | 12.8 | 10 | 0.24 | 2.2 |
| 11 | 0.12 | 9.0 | 11 | 0.21 | 2.1 |
| 12 | 0.20 | 9.7 | 12 | 0.38 | 1.9 |

TABLE 7

| Classification | Distributional Composition (% by weight) | | | | | | | | | | Binding phase enhanced surface portion | |
|---|---|---|---|---|---|---|---|---|---|---|---|---|
| | Co | Ni | TaC | NbC | WC | Mo2C | ZrC | TiC | TiN | TiCN | Max incorporated amount of binding phase (% by wt) | Thickness (μm) |
| Cermet substrate | | | | | | | | | | | | |
| G | 4 | 8 | 10 | 1 | 10 | 10 | — | R | 30 | — | — | — |
| H | 12 | 6 | 8 | — | 15 | 10 | 0.5 | R | 20 | — | — | — |
| I | 10 | 10 | — | 10 | 10 | 6 | — | — | 10 | R | — | — |
| J | 7 | 7 | 10 | 1 | 8 | 8 | — | — | 5 | R | 20 | 10 |
| K | 12 | 4 | 12 | — | 15 | — | — | R | 35 | — | 28 | 20 |
| L | 13 | 5 | 15 | — | 15 | — | 0.5 | — | — | R | 22 | 15 |

R = Remaining portion

TABLE 8

| | | Crystal structure of the TiCN layer | | | | | Amount of flank wear (mm) | |
|---|---|---|---|---|---|---|---|---|
| Classification | Substate number | First layer (Thickness: μm) | Second layer (Thickness: μm) | Third layer (Thickness: μm) | Fourth layer (Thickness: μm) | Fifth layer (Thickness: μm) | Cutting Material: Steel | Cutting Material: Cast-iron |
| Cutting tool covering of the present invention | | | | | | | | |
| 13 | G | P + L(U) (6) | — | — | — | — | 0.17 | 0.16 |
| 14 | | P + L(I) + P (4) | L(B) + P (2) | P (1) | — | — | 0.16 | 0.15 |
| 15 | H | P + L(I) + P (8) | — | — | — | — | 0.14 | 0.21 |
| 16 | | P + L(U) (3) | P + L(U) (3) | P + L(U) (3) | P + L(U) (3) | P + L(I) + P (3) | 0.12 | 0.18 |
| 17 | I | L(B) + P (4) | — | — | — | — | 0.19 | 0.22 |
| 18 | | P + L(U) (4) | P + L(I) + P (3) | L(B) + P (2) | — | — | 0.15 | 0.19 |

TABLE 8-continued

| Classification | Substate number | Crystal structure of the TiCN layer ||||| Amount of flank wear (mm) ||
| | | First layer (Thickness: μm) | Second layer (Thickness: μm) | Third layer (Thickness: μm) | Fourth layer (Thickness: μm) | Fifth layer (Thickness: μm) | Cutting Material: Steel | Cutting Material: Cast-iron |
|---|---|---|---|---|---|---|---|---|
| 19 | J | P + L(U) (6) | P (1) | — | — | — | 0.16 | 0.14 |
| 20 | | P (1) | L(B) + P (4) | L(B) + P (3) | L(B) + P (2) | — | 0.12 | 0.13 |
| 21 | K | P + L(U) (7) | P + L(U) (1) | — | — | — | 0.14 | 0.16 |

Note:
P = Granular crystal structure; L = Longitudinal growth crystal structure
U = Upper layer; I = Intermediate layer; B = Lower layer
*Thickness represents the average thickness

TABLE 9

| Classification | Substate number | Crystal structure of the TiCN layer ||||| Amount of flank wear (mm) ||
| | | First layer (Thickness: μm) | Second layer (Thickness: μm) | Third layer (Thickness: μm) | Fourth layer (Thickness: μm) | Fifth layer (Thickness: μm) | Cutting Material: Steel | Cutting Material: Cast-iron |
|---|---|---|---|---|---|---|---|---|
| Cutting tool covering of the present invention |||||||||
| 22 | K | P (0.5) | L(B) + P (4) | P (1) | L(B) + P (4) | P (0.5) | 0.13 | 0.14 |
| 23 | L | P + L(I) + P (3) | P (1) | — | — | — | 0.21 | 0.23 |
| 24 | | P + L(I) + P (5) | L(B) + P (3) | L(B) + P (3) | — | — | 0.14 | 0.21 |
| Prior art cutting tool coverage |||||||||
| 13 | G | P (6) | — | — | — | — | 9 min. tool life due to chipping | 7 min. tool life due to chipping |
| 14 | H | P (8) | — | — | — | — | 6 min. tool life due to chipping | 2 min. tool life due to chipping |
| 15 | I | P (4) | — | — | — | — | 11 min. tool life due to chipping | 9 min. tool life due to chipping |
| 16 | J | P (10) | — | — | — | — | 5 min. tool life due to chipping | 3 min. tool life due to chipping |
| 17 | K | P (10) | — | — | — | — | 4 min. tool life due to chipping | 2 min. tool life due to chipping |
| 18 | L | P (11) | — | — | — | — | 6 min. tool life due to chipping | 5 min. tool life due to chipping |

Note:
P = Granular crystal structure; L = Longitudinal growth crystal structure
U = Upper layer; I = Intermediate layer; B = Lower layer
*Thickness represents the average thickness

TABLE 10

| Classification | Substate number | Hard covering layer ||||||||
| | | Crystal structure of the lower layer (TiCN layer) and average thickness of each layer (μm) |||| Composition of the upper layer and average thickness of each layer (μm) ||||
| | | First layer | Second layer | Third layer | Fourth layer | First layer | Second layer | Third layer | Fourth layer |
|---|---|---|---|---|---|---|---|---|---|
| Cutting tool covering of the present invention ||||||||||
| 25 | G | P + L(U) (5) | — | — | — | TiCO (0.5) | $Al_2O_3$ (1) | — | — |
| 26 | | P + L(I) + P (6) | L(B) + P (2) | — | — | TiN (0.5) | — | — | — |
| 27 | H | L(B) + P (4) | — | — | — | TiC (2) | TiN (1) | — | — |
| 28 | I | P + L(U) (2) | P + L(U) (2) | P + L(U) (2) | P + L(U) (2) | TiCNO (0.5) | $Al_2O_3$ (1) | — | — |
| 29 | J | P + L(I) + P (2) | — | — | — | TiC (2) | TiCNO (0.5) | $Al_2O_3$ (1) | TiN (0.5) |
| 30 | | P + L(U) (2) | P + L(I) + P (3) | L(B) + P (2) | — | TiN (1) | — | — | — |
| 31 | K | P + L(U) (7) | — | — | — | TiN (1) | — | — | — |
| 32 | L | P + L(I) + P | L(B) + P | P + L(U) | P + L(U) | TiN | — | — | — |

TABLE 10-continued

| Classifi-cation | Substate number | Hard covering layer ||||||||
|---|---|---|---|---|---|---|---|---|---|
| | | Crystal structure of the lower layer (TiCN layer) and average thickness of each layer (μm) |||| Composition of the upper layer and average thickness of each layer (μm) ||||
| | | First layer | Second layer | Third layer | Fourth layer | First layer | Second layer | Third layer | Fourth layer |
| | | (2.5) | (2) | (2) | (2) | (0.5) | | | |

Note:
P = Granular crystal structure; L = Longitudinal growth crystal structure
U = Upper layer; I = Intermediate layer; B = Lower layer

TABLE 11

| Hard covering layer composition | Conditions for forming the hard covering layer granular structure |||
|---|---|---|---|
| | Reaction gas composition (% by volume) | Reaction environment ||
| | | Pressure (Torr) | Temp (°C.) |
| TiC | TiCl$_4$: 4%, CH$_4$: 5%, H$_2$: 91% | | 1030 |
| TiN | TiCl$_4$: 4%, N$_2$: 8%, H$_2$: 88% | | 1000 |
| TiCN | TiCl$_4$: 4%, CH$_4$: 3%, N$_2$: 4%, H$_2$: 89% | 100 | 980 |
| TiCO | TiCl$_4$: 4%, CO: 6%, H$_2$: 90% | | 1000 |
| TiCNO | TiCl$_4$: 4%, CO: 3%, N$_2$: 3%, H$_2$: 90% | | 1000 |
| Al$_2$O$_3$ | Al$_2$O$_3$: 3%, CO$_2$: 5%, H$_2$: 92% | | 1050 |

TABLE 12

| Classifi-cation | Substate number | Composition of the hard covering layer and thickness of each layer (μm) |||||
|---|---|---|---|---|---|---|
| | | First layer | Second layer | Third layer | Fourth layer | Fifth layer |
| Prior art cutting tool covering |||||||
| 19 | G | TiCN (5) | TiCO (0.5) | Al$_2$O$_3$ (1) | — | — |
| 20 | | TiCN (8) | TiN (0.5) | — | — | — |
| 21 | H | TiCN (4) | TiC (2) | TiN (1) | — | — |
| 22 | I | TiCN (8) | TiCNO (0.5) | Al$_2$O$_3$ (1) | — | — |
| 23 | J | TiCN (2) | TiC (2) | TiCNO (0.5) | Al$_2$O$_3$ (1) | TiN (0.5) |
| 24 | | TiCN (8) | TiN (1) | — | — | — |
| 25 | K | TiCN (7) | TiN (1) | — | — | — |
| 26 | L | TiCN (5) | TiN (0.5) | — | — | — |

TABLE 13

| Classifi-cation | Amount of flank wear (mm) ||
|---|---|---|
| | Cutting Material: Steel | Cutting Material: Cast-iron |
| Cutting tool covering of the present invention |||
| 25 | 0.15 | 0.12 |
| 26 | 0.13 | 0.12 |
| 27 | 0.16 | 0.14 |
| 28 | 0.18 | 0.16 |
| Prior art cutting tool covering |||
| 19 | 7 min. tool life due to chipping | 5 min. tool life due to chipping |
| 20 | 6 min. tool life due to chipping | 4 min. tool life due to chipping |
| 21 | 8 min. tool life due to chipping | 8 min. tool life due to chipping |
| 22 | 3 min. tool life due to chipping | 2 min. tool life due to chipping |
| 29 | 0.15 | 0.14 |
| 30 | 0.14 | 0.16 |
| 31 | 0.13 | 0.15 |
| 32 | 0.17 | 0.18 |
| 23 | 9 min. tool life due to chipping | 10 min. tool life due to chipping |
| 24 | 7 min. tool life due to chipping | 4 min. tool life due to chipping |
| 25 | 8 min. tool life due to chipping | 5 min. tool life due to chipping |
| 26 | 6 min. tool life due to chipping | 8 min. tool life due to chipping |

TABLE 14

| Class-ifi-cation | Substate number | Hard covering layer ||||||||
|---|---|---|---|---|---|---|---|---|---|
| | | Crystal structure of the lower layer (TiCN layer) and average thickness of each layer (μm) |||| Composition of the upper layer and average thickness of each layer (μm) ||||
| | | First layer | Second layer | Third layer | Fourth layer | First layer | Second layer | Third layer | Fourth layer |
| Cutting tool covering of the present invention |||||||||| 
| 33 | G | TiN (1) | — | — | — | P + L(U) (2) | P + L(I) + P (2) | Al$_2$O$_3$ (2) | TiN (1) |
| 34 | | TiCN (1) | TiCO (1) | — | — | P + L(I) + P (3) | — | — | — |
| 35 | H | TiCNO | TiC | — | — | TiCN | L(B) + P | TiC | P + L(I) + P |

TABLE 14-continued

| | | Hard covering layer | | | | | | | |
|---|---|---|---|---|---|---|---|---|---|
| | | Crystal structure of the lower layer (TiCN layer) and average thickness of each layer (μm) | | | | Composition of the upper layer and average thickness of each layer (μm) | | | |
| Classification | Substrate number | First layer | Second layer | Third layer | Fourth layer | First layer | Second layer | Third layer | Fourth layer |
| 36 | I | (0.5) TiCN | (1) TiN | — | — | (1) P + L(U) | (3) P + L(U) | (0.5) TiCN | (3) Al₂O₃ |
| | | (1) | (1) | | | (2) | (2) | (0.5) | (2) |
| 37 | J | TiCN | TiC | TiN | — | L(B) + P | TiN | — | — |
| | | (1) | (1.5) | (0.5) | | (3) | (1) | | |
| 38 | | TiC | — | — | — | P + L(I) + P | TiN | — | — |
| | | (0.5) | | | | (5) | (0.5) | | |
| 39 | K | TiCN | — | — | — | P + L(U) | P + L(I) + P | L(B) + P | — |
| | | (1) | | | | (2) | (2) | (2) | |
| 40 | L | TiN | TiC | TiCO | Al₂O₃ | TiCN | P + L(U) | — | — |
| | | (1) | (1) | (0.5) | (2) | (0.5) | (2) | | |

Note:
P = Granular crystal structure; L = Longitudinal growth crystal structure
U = Upper layer; I = Intermediate layer; B = Lower layer

TABLE 15

| Classification | Substrate number | Composition and average thickness of the hard covering layer (μm) | | | | |
|---|---|---|---|---|---|---|
| | | First layer | Second layer | Third layer | Fourth layer | Fifth layer |
| Prior art cutting tool covering | | | | | | |
| 27 | G | TiN (1) | TiCN (4) | Al₂O₃ (2) | TiN (1) | — |
| 28 | | TiCN (1) | TiCO (0.5) | TiCN (3) | — | — |
| 29 | H | TiCNO (0.5) | TiC (1) | TiCN (4) | TiC (0.5) | TiCN (3) |
| 30 | | TiCN (1) | TiN (1) | TiCN (4) | TiCNO (0.5) | Al₂O₃ (2) |
| 31 | I | TiCN (6) | TiN (1) | — | — | — |
| 32 | | TiC (0.5) | TiCN (5) | TiN (0.5) | — | — |
| 33 | J | TiCN (1) | TiC (1) | TiCN (6) | — | — |
| 34 | | TiN (1) | TiC (1) | TiCO (0.5) | Al₂O₃ (2) | TiCN (3) |

TABLE 16

| Classification | Amount of flank wear (mm) | | Classification | Amount of flank wear (mm) | |
|---|---|---|---|---|---|
| | Cutting material: steel | Cutting material: cast-iron | | Cutting material: steel | Cutting material: cast-iron |
| Cutting tool covering of the present invention | | | Prior art cutting tool covering | | |
| 33 | 0.15 | 0.17 | 27 | 6 min. tool life due to chipping | 7 min. tool life due to chipping |
| 34 | 0.20 | 0.21 | 28 | 9 min. tool life due to chipping | 9 min. tool life due to chipping |
| 35 | 0.13 | 0.17 | 29 | 5 min. tool life due to chipping | 3 min. tool life due to chipping |
| 36 | 0.18 | 0.16 | 30 | 4 min. tool life due to chipping | 6 min. tool life due to chipping |
| 37 | 0.15 | 0.13 | 31 | 9 min. tool life due to chipping | 8 min. tool life due to chipping |
| 38 | 0.16 | 0.17 | 32 | 10 min. tool life due to chipping | 9 min. tool life due to chipping |
| 39 | 0.13 | 0.16 | 33 | 6 min. tool life due to chipping | 4 min. tool life due to chipping |
| 40 | 0.19 | 0.17 | 34 | 4 min. tool life due to chipping | 3 min tool life due to chipping |

What is claimed is:

1. A cutting tool comprising:
a) a substrate formed from titanium carbo-nitride based cermet; and
b) at least one hard coating layer of average thickness 0.5~20 μm, formed onto at least a portion of the surface of said substrate,
wherein said at least one hard coating layer comprises a layer formed from a compound selected from the group consisting of titanium carbide (TiC), titanium nitride (TiN), titanium carbo-nitride (TiCN), titanium carbo-oxide (TiCO) and titanium carbo-oxi-nitride (TiCNO), and aluminum oxide (Al₂O₃), and said at least one hard coating layer includes a titanium carbo-nitride layer having a longitudinal growth crystal structure in which crystal grains are elongated along a direction perpendicular to the surface of said substrate.

2. A cutting tool according to claim 1 wherein said cermet substrate comprises:
70~95% by weight of a solid solution of carbo-nitride represented by the formula $(Ti_xM_y)(C_uN_v)$, (wherein M is at least one metal selected from the group consisting of transition metals in groups $IV_A$, $V_A$ and $VI_A$ of the Periodic TABLE with the exception of titanium, and x, y, u and v are molar ratios which satisfy the relations of $x+y=1$, $u+v=1$, $0.5 \leq x \leq 0.95$, $0.05 \leq y \leq 0.5$, $0.2 \leq u \leq 0.8$ and $0.2 \leq v \leq 0.8$) as a hard-dispersed phase-constituting component; and at least one metal selected from the group consisting of cobalt and nickel as a binder phase-constituting component.

3. A cutting tool according to claim 2 wherein said binder phase-constituting component is contained in a relatively greater amount near the surface of said cermet substrate.

4. A cutting tool according to claim 1 wherein said at least one hard coating layer comprises at least one of the following crystal structures:
  (1) a crystal structure which changes from a granular crystal structure to a longitudinal growth crystal structure as it progresses away from the aforementioned substrate;
  (2) a crystal structure which changes from a granular crystal structure to a longitudinal growth crystal structure and back to a granular crystal structure as it progresses away from the aforementioned substrate; and
  (3) a crystal structure which changes from a longitudinal growth crystal structure to a granular crystal structure as it progresses away from the aforementioned substrate.

5. A cermet cutting tool according to claim 4 wherein said cermet substrate comprises:
  70–95% by weight of a solid solution of carbo-nitride represented by the formula $(Ti_xM_y)(C_uN_v)$, (wherein M is at least one metal selected from the group consisting of transition metals in groups $IV_A$, $V_A$ and $VI_A$ of the Periodic Table with the exception of titanium, and x, y, u and v are molar ratios which satisfy the relations of $x+y=1$, $u+v=1$, $0.5 \leq x \leq 0.95$, $0.05 \leq y \leq 0.5$, $0.2 \leq u \leq 0.8$ and $0.2 \leq v \leq 0.8$) as a hard-dispersed phase-constituting component; and
  at least one metal selected from the group consisting of cobalt and nickel as a binder phase-constituting component.

6. A cermet cutting tool according to claim 5 wherein said binder phase-constituting component is contained in a relatively greater amount near the surface of said cermet substrate.

7. A cutting tool comprising:
  a. a substrate formed from titanium carbo-nitride based cermet; and
  b. a hard coating layer of average thickness 0.5~20 μm, formed onto the surface of said substrate comprising at least one lower layer of the compound titanium carbo-nitride, and an upper layer formed from a compound selected from the group consisting of titanium carbide (TiC), titanium nitride (TiN), titanium carbo-nitride (TiCN), titanium carbo-oxide (TiCO), titanium carbo-oxi-nitride (TiCNO) and aluminum oxide ($Al_2O_3$); said lower layer comprises at least one of the following crystal structures:
    (1) a crystal structure which changes from a granular crystal structure to a longitudinal growth crystal structure as it progresses away from the aforementioned substrate;
    (2) a crystal structure which changes from a granular crystal structure to a longitudinal growth crystal structure and back to a granular crystal structure as it progresses away from the aforementioned substrate; and
    (3) a crystal structure which changes from a longitudinal growth crystal structure to a granular crystal structure as it progresses away from the aforementioned substrate; and
  said hard coating layer including a titanium carbo-nitride layer having a longitudinal growth crystal structure in which crystal grains are elongated along a direction perpendicular to the surface of said substrate.

8. A cermet cutting tool according to claim 7 wherein said cermet substrate comprises:
  70~95% by weight of a solid solution of carbo-nitride represented by the formula $(Ti_xM_y)(C_uN_v)$, (wherein M is at least one metal selected from the group consisting of transition metals in groups $IV_A$, $V_a$ and $VI_A$ of the Periodic Table with the exception of titanium, and x, y, u and v are molar ratios which satisfy the relations of $x+y=1$, $u+v=1$, $0.5 \leq x \leq 0.95$, $0.05 \leq y \leq 0.5$, $0.2 \leq u \leq 0.8$ and $0.2 \leq v \leq 0.8$) as a hard-dispersed phase-constituting component; and
  at least one metal selected from the group consisting of cobalt and nickel as a binder phase-constituting component.

9. A cermet cutting tool according to claim 8 wherein said binder phase-constituting component is contained in a relatively greater amount near the surface of said cermet substrate.

10. A cermet cutting tool comprising:
  a. a substrate formed from titanium carbo-nitride based cermet; and
  b. a hard coating layer of average thickness 0.5~20 μm, formed onto the surface of said substrate comprising a lower layer formed from at least one layer of a compound selected from the group consisting of titanium carbide (TiC), titanium nitride (TiN), titanium carbo-nitride (TiCN), titanium carbo-oxide (TiCO and titanium carbo-oxi-nitride (TiCNO), and an upper layer formed from at least one layer of a compound selected from the group consisting of titanium carbide (TiC), titanium nitride (TiN), titanium carbo-nitride (TiCN), titanium carbo-oxide (TiCO), titanium carbo-oxi-nitride (TiCNO) and aluminum oxide ($Al_2O_3$); wherein at least one of said layers comprising said upper layer is a titanium carbo-nitride layer, and at least one layer of said titanium carbo-nitride layer comprises at least one of the following crystal structures:
    (1) a crystal structure which changes from a granular crystal structure to a longitudinal growth crystal structure as it progresses away from the aforementioned substrate;
    (2) a crystal structure which changes from a granular crystal structure to a longitudinal growth crystal structure and back to a granular crystal structure as it progresses away from the aforementioned substrate; and
    (3) a crystal structure which changes from a longitudinal growth crystal structure to a granular crystal structure as it progresses away from the aforementioned substrate; and
  said hard coating layer including a titanium carbo-nitride layer having a longitudinal growth crystal structure in which crystal grains are elongated along a direction perpendicular to the surface of said substrate.

11. A cermet cutting tool according to claim 10 wherein said cermet substrate comprises:
  70~95% by weight of a solid solution of carbo-nitride represented by the formula $(Ti_xM_y)(C_uN_v)$, (wherein M is at least one metal selected from the group consisting of transition metals in groups $IV_A$, $V_a$ and $VI_A$ of the Periodic Table with the exception of titanium, and x, y, u and v are molar ratios which satisfy the relations of $x+y=1$, $u+v=1$, $0.5 \leq x \leq 0.95$, $0.05 \leq y \leq 0.5$, $0.2 \leq u \leq 0.8$ and $0.2 \leq v \leq 0.8$) as a hard-dispersed phase-constituting component; and at least one metal selected from the group consisting of cobalt and nickel as a binder phase-constituting component.

12. A cermet cutting tool according to claim 11 wherein said binder phase-constituting component is contained in a relatively greater amount near the surface of said cermet substrate.

* * * * *

UNITED STATES PATENT AND TRADEMARK OFFICE
CERTIFICATE OF CORRECTION

PATENT NO. : 5,436,071
DATED : July 25, 1995
INVENTOR(S) : Niro Odani, et al.

It is certified that error appears in the above-indentified patent and that said Letters Patent is hereby corrected as shown below:

On the Title Page, item [57];
In the Abstract, line 8: "(TIN)" should read --(TiN)--
Column 1, line 37: "(TIC)" should read --(TiC)--
Column 2, line 62 "(TIC)" should read --(TiC)--
Column 3, lines 40 & 68: "(TIC)" should read --(TiC)--
Column 3, line 41: "(TIN)" should read --(TiN)--
Column 4, lines 1 & 6: "(TIN)" should read --(TiN)--
Column 4, line 6: "(TIC)" should read --(TiC)--
Column 4, line 57: "ocher" should read --other--
Column 7, line 58: "1 m" should read --1mm--.
Column 7, line 64: "m/rev." should read --mm/rev.--
Column 23, line 26, Claim 5: "70-95%" should read --70~95%--
Column 24, line 13, Claim 8: "V$_a$" should read --V$_A$--
Column 25, line 2, Claim 11: "V$_a$" should read --V$_A$--

Signed and Sealed this

Twentieth Day of February, 1996

Attest:

Attesting Officer

BRUCE LEHMAN
Commissioner of Patents and Trademarks